US007678515B2

(12) United States Patent
Morimitsu et al.

(10) Patent No.: US 7,678,515 B2
(45) Date of Patent: Mar. 16, 2010

(54) THERMALLY GATED PHOTOCHROMIC MEDIUM

(75) Inventors: Kentaro Morimitsu, Mississauga (CA); Tyler Norsten, Oakville (CA); Gabriel Iftime, Mississauga (CA); Peter Kazmaier, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 12/190,531

(22) Filed: Aug. 12, 2008

(65) Prior Publication Data

US 2010/0041551 A1 Feb. 18, 2010

(51) Int. Cl.
*G03F 7/00* (2006.01)
*G03F 7/004* (2006.01)

(52) U.S. Cl. ................. 430/19; 430/270.1; 430/270.15; 430/945

(58) Field of Classification Search ................... 430/19, 430/270.1, 270.15, 945
See application file for complete search history.

(56) References Cited

U.S. PATENT DOCUMENTS

| | | | | |
|---|---|---|---|---|
| 3,961,948 | A | 6/1976 | Saeva | |
| 6,067,185 | A | 5/2000 | Albert et al. | |
| 7,057,054 | B2 | 6/2006 | Irie | |
| 7,214,456 | B2 | 5/2007 | Iftime et al. | |
| 7,300,727 | B2 | 11/2007 | Kazmaier et al. | |
| 7,316,875 | B2 | 1/2008 | Iftime et al. | |
| 7,381,506 | B2 * | 6/2008 | Iftime et al. | 430/19 |
| 2007/0072110 | A1 * | 3/2007 | Iftime et al. | 430/270.1 |

FOREIGN PATENT DOCUMENTS

| | | | |
|---|---|---|---|
| JP | 2002285146 | A * | 10/2002 |
| JP | 2003255490 | A * | 9/2003 |
| JP | 2004045037 | A * | 2/2004 |

OTHER PUBLICATIONS

Irie, “Diarylethylenes for Memories and Switches”, Chemical Reviews (2000).100. 1685-1716.*
Machine translation of JP 2003-255490 (no date).*
J. Org. Chem., Dithienylethenes with a Novel Photochromic Performance, Kentaro Morimitsu et al., vol. 67, No. 13, 2002, pp. 4574-4578.
J. Am. Chem. Soc., Photochromic Diarylethenes with Intralocking Arms, Masahiro Irie et al., vol. 116, No. 22, 1994, pp. 9894-9900.
U.S. Appl. No. 11/762,177, filed Jun. 13, 2007, Inkless Reimageable Printing Paper and Method, Inventors: Tyler Norsten, et al., pp. 1-42.

* cited by examiner

*Primary Examiner*—Amanda C. Walke
(74) *Attorney, Agent, or Firm*—Pillsbury Winthrop Shaw Pittman LLP

(57) ABSTRACT

The presently disclosed embodiments are directed to image forming mediums useful for reimageable and transient documents. More particularly, the embodiments pertain to an image forming medium comprising thermally gated photochromic materials comprising diarylethene (DAE) photochromes which avoid problems with unwanted reduction in color contrast due to background coloration.

24 Claims, No Drawings

THERMALLY GATED PHOTOCHROMIC MEDIUM

BACKGROUND

The present embodiments relate generally to an improved photochromic medium that can be used for reimageable documents. More particularly, the present embodiments are directed to a photochromic material for transient documents which is temperature dependent (thermal gating) and can suppress background coloration under ambient office conditions.

Many paper documents are promptly discarded after being read. Although paper is generally inexpensive, the quantity of discarded paper documents is enormous and the disposal of these discarded paper documents raises significant cost and environmental issues. The present invention addresses the above described problem by providing in embodiments an improved photochromic medium for containing the desired image, a new method to prepare such a medium, and a new image forming method.

Imaging techniques employing photochromic materials, that is materials which undergo reversible or irreversible photoinduced color changes are known, for example, U.S. Pat. No. 3,961,948 discloses an imaging method based upon visible light induced changes in a photochromic imaging layer containing a dispersion of at least one photochromic material in an organic film forming binder and is hereby incorporated by reference. These and other photochromic (or reimageable or electric) papers are desirable because they can provide imaging media that can be re-used many times, to transiently store images and documents. For example, applications for photochromic based media include reimageable documents such as, for example, electronic paper documents.

Transient documents and photochromic paper for transient documents have already been reported in U.S. Pat. No. 7,300,727 and U.S. Pat. No. 7,214,456, where images printed on photochromic paper can be read for a few hours under room light conditions, and the transient documents self-erase with no effort from the user and are ready to be printed again with new images the next day. The resulting blank sheet of paper is ready to be printed again with new information, and the paper may be reusable many times.

A different application for photochromic based media is for reimageable documents, and as mentioned above, for electronic paper documents. Reimageable documents require information to be kept for as long as the user wants, then the information can be erased or the reimageable document can be re-imaged using an imaging system with different information. Written images on electronic paper may be readable for longer period of time such as, for example, many days or weeks. For example, in U.S. Pat. No. 7,316,875, incorporated herein by reference, it was discovered that solutions in acetone of spiropyrans modified with chelating groups in the presence of metallic cations had life-times of at least several days. In contrast, a classical spiropyran molecule, containing no chelating groups, is stable in its colored form for only a few minutes.

However, photochromic materials based on spiroyrans are "self-erasing" in that once an image is created, the colorant decays by a thermal process to the colorless state. Longer life-time may be desirable in that an image formed on a medium remains stable for a longer period of time. For example, a user may want to view an image for a longer period than a few hours. This is the case for electronic paper documents, which should maintain an written image for as long as the user needs to view it. The image may then be erased or changed with a different one by the user on command. Thus, there is a continued need for devising improved photochromic mediums that can be used for reimageable documents with an "erase-on-demand" capability.

SUMMARY

According to aspects illustrated herein, there is provided an image forming medium, comprising a substrate, and an imaging layer coated on or impregnated into the substrate, wherein the imaging layer comprises an imaging composition that exhibits a reversible transition between a colorless state and a colored state and further comprises a thermally gated diarylethene photochromic material dissolved in a solvent or polymeric binder.

Another embodiment provides an image forming medium, comprising a substrate, and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a diarylethene molecule having hydrogen bond forming groups bonded together through hydrogen bonds, and further wherein the hydrogen bond forming groups are attached at phenyl groups at both ends of the diarylethene molecule or are attached at 2-positions of thiophene moieties at both ends of the diarylethene molecule.

Yet another embodiment, there is provided a method for forming an image, comprising providing an image forming medium comprising a substrate, and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a diarylethene molecule in a photochromically inactive parallel conformation to prevent coloration reaction, and exposing the image forming medium to ultraviolet irradiation of a first wavelength and heat in an imagewise manner to form a visible image.

DETAILED DESCRIPTION

In the following description, reference is made to the accompanying drawings, which form a part hereof and which illustrate several embodiments. It is understood that other embodiments may be used and structural and operational changes may be made without departure from the scope of the present disclosure.

As stated previously, the present embodiments provide an image forming medium, comprising a substrate, and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a hydrogen bond containing diarylethene molecule wherein the hydrogen bonds act in preventing the coloration reaction at or below ambient temperatures. In embodiments a thermally gated photochromic material is a diarylethene molecule with hydrogen bonding groups capable of forming intra or inter molecular hydrogen bonds that impede or prevent coloration at ambient or below ambient temperatures. In further embodiments, the thermally gated photochromic material is a diarylethene molecule having hydrogen bond forming groups, for example carboxy, hydroxy, amino, amide, and peptide groups, bonded together through hydrogen bonds, and further wherein the hydrogen bond forming groups are attached on either side of the ethene portion of a diarylethene molecule such that they form intramolecular hydrogen bonds. The present embodiments also provide a method for forming an image, comprising providing an image forming medium comprising a substrate, and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a diarylethene molecule wherein exposing the image forming medium to ultraviolet irradiation of a first wavelength and heat in an imagewise manner results in the formation of a visible image.

Generally, the present embodiments relate to an improved photochromic medium that can be used for reimageable documents. More particularly, the present embodiments are directed to a photochromic paper for transient documents which employ thermally gated photochromic materials comprising diarylethene (DAE) photochromes. Use of such these DAE photochromes were shown to avoid problems with coloration of the non-imaged areas of the paper resulting in a reduction in color contast which can appear after prolonged exposure to ambient office lighting conditions.

Employing specific DAE photochromes dissolved in a solvent or polymeric binder in photochromic materials have shown to exhibit an "erase-on-demand" capability. The erase-on-demand capability is made possible by a photochromic material comprising unsymmetrical DAE photochromes, where the photochrome contains both alkoxy and alkyl groups on opposite arms of the photochrome. The photochromic material exhibits a reversible transition between a colorless (e.g., the complete or substantial absence of visible wavelengths) and a colored state (e.g., the presence of visible wavelengths). Furthermore, exposing the imaging layer to a first stimulus, such as ultraviolet (UV) light irradiation, causes the photochromic material to convert from the colorless state to a colored state. Likewise, exposing the imaging layer to a second stimulus, such as visible light irradiation and optional heat, causes the photochromic material to convert from a colored state to a colorless state. Thus, an image forming medium incorporating such photochromic materials provides a very useful erase-on-demand capability which can have many applications.

Photochromism and thermochromism are defined as the reversible photocoloration of a molecule from exposure to light (electromagnetic radiation) and heat (thermal radiation) based stimuli, respectively. Typically photochromic molecules undergo structural and/or electronic rearrangements when irradiated with UV light that converts them to a more conjugated colored state. In the case of photochromic molecules, the colored state can typically be converted back to the original colorless state by irradiating the molecule with visible light. In some cases, thermal energy can also be used to de-colorize a photochrome. If the interconversion is also capable thermally (through application of heat), as is the case in alkoxy-substituted dithienylethenes, spiropyrans, azobenzenes, Schiff bases and the like, the molecules are classified as both thermochromic and photochromic. Photochromic compounds are bi-stable in absence of light whereas photochromic-thermochromic hybrid compounds can fade in the absence of light through a thermal process to the thermodynamically more stable colorless state. To create a stable reimageable document, it is desired to stabilize the colored state, specifically to ambient conditions that the document will encounter in everyday life, such as broad band light and various heating/cooling conditions. For example, U.S. patent application Ser. No. 11/762,177, filed Jun. 13, 2007 to Tyler Norsten et al., discloses use of alkoxy substituted diarylethene dispersed in a solvent or polymeric binder as a photochromic material which provides transient images lasting longer periods and that are reasonably stable to ambient visible light and thermal conditions. However, it is desirable that the photochrome also have the ability to be quickly and quantitatively erased when desired to allow rapid writing, erasing and re-writing of the document.

It has been discovered that asymmetrical DAEs that are appropriately substituted ($R_1$=alkyl & $R_2$=alkoxy) or symmetrical alkoxy DAEs ($R_1$ & $R_2$=alkoxy) can provide erase-on-demand colorants. Diarylethenes are a class of photochromic materials which undergo reversible color change when irradiated with appropriate wavelength of light. Typically, the initial state is colorless, but the compound becomes colored state when it is exposed to ultraviolet (UV) light. The resulting colored state can revert back to the initial colorless state by irradiation with visible light (Scheme 1). The color change can be repeated many times without any decomposition of the molecule. This color switching is caused by a chemical structural change which involves an absorption spectral change in the visible region. Both of the colorless and the colored states are thermally quite stable and in the case of ($R_1$ & $R_2$=alkyl) never change color in the dark at ambient temperature Scheme 1. Photochromic reaction of diarylethene ($R_1$ & $R_2$ = any alkyl, alkoxy groups).

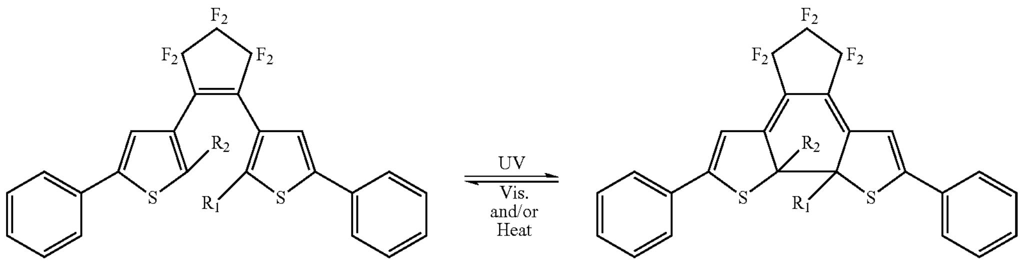

Colorless state

Colored state

Furthermore, unsymmetrical DAEs that are appropriately substituted ($R_1$=alkyl & $R_2$=alkoxy) or symmetrical alkoxy DAEs ($R_1$ & $R_2$=alkoxy) have been found to increase the stability of the colored states to visible light for longer periods while at the same time lowering the barrier to thermal decolorization. See, for example, "Dithienylethenes with a Novel Photochromic Performance", J. Org. Chem., 2002, 67, 4574-4578, and U.S. Pat. No. 7,057,054, the entire disclosures of which are incorporated herein by reference. Thus, such unsymmetrical DAEs and symmetrical alkoxy DAEs provide longer image lifetimes under normal office lighting conditions with an erase-on-demand capability to the image forming mediums that incorporate the DAEs.

Although diarylethenes are promising candidates of photochromes for a reusable, rewritable or erasable paper system, we discovered a problem in that the background, or non-imaged area of the paper colorized even under typical white fluorescent lights in normal office conditions. While UV-generated images remained readable for a longer period of time with diarylethenes, it was found that the entire surface of the document gradually darkened in color and the image could not be discerned due to a reduction in color contrast between the imaged and non-imaged areas after several hours to several days. We discovered that the cause of this background coloration was found to be due to the same factor that gives the DAEs stability to achieve its long term image permanence. Because exposure to UV light initiates the colored state, we found that the small component of UV light present in all typical white fluorescent-based bulbs examined was sufficient to color the media. Thus, due to the increased thermal and/or photochemical stability of DAE-based photochromic materials, exposure to ambient office conditions eventually caused the background of the medium to color as well. Reduction in color contrast due to background coloration was not significant in various other photochrome containing media such as selected spiropyran-based (self-erasing) reusable documents since the thermal erase reaction overwhelmed background buildup from ambient fluorescent light UV coloration.

The present embodiments employ a new class of diarylethene that can form intramolecular hydrogen bonds to prevent coloration, for example by locking a photochromically inactive conformation into place at ambient or below ambient temperature while still allowing coloration and decoloration at temperatures above ambient or elevated temperatures. In this manner, the coloration reaction under normal ambient light and temperature office conditions can be prevented such that background coloration or reduction in color contrast will not appear in reusable documents based on thermally gated DAEs.

The present embodiments are based on controlling the molecular conformation of the colorless state. It is known that the colorless state of diarylethene can have two different conformations—an "anti-parallel conformation" which is photochromically active and a "parallel conformation" which is inactive, to undergo ring-closing photochromic reaction (Scheme 2). Therefore, the anti-parallel conformation is required to enable the photochromic color change. These conformations are inter-changeable because the single bonds between the thiophene rings and the perfluorocyclopentene ring allow free rotation so that these conformers usually exist in 1:1 ratio in solution. If the anti-parallel conformation does not exist at all and 100 percent of the parallel conformation dominates in the system, then the photochromic reaction is suppressed even in the presence of UV light. For that reason, the control of the parallel/anti-parallel conformation is the key prerequisite step to control the photochromic coloration reaction of diarylethenes. As such, the present embodiments incorporate hydrogen bond groups such as carboxy groups to control the relative proportions of the two molecular conformations.

Scheme 2. Molecular conformations of diarylethene.

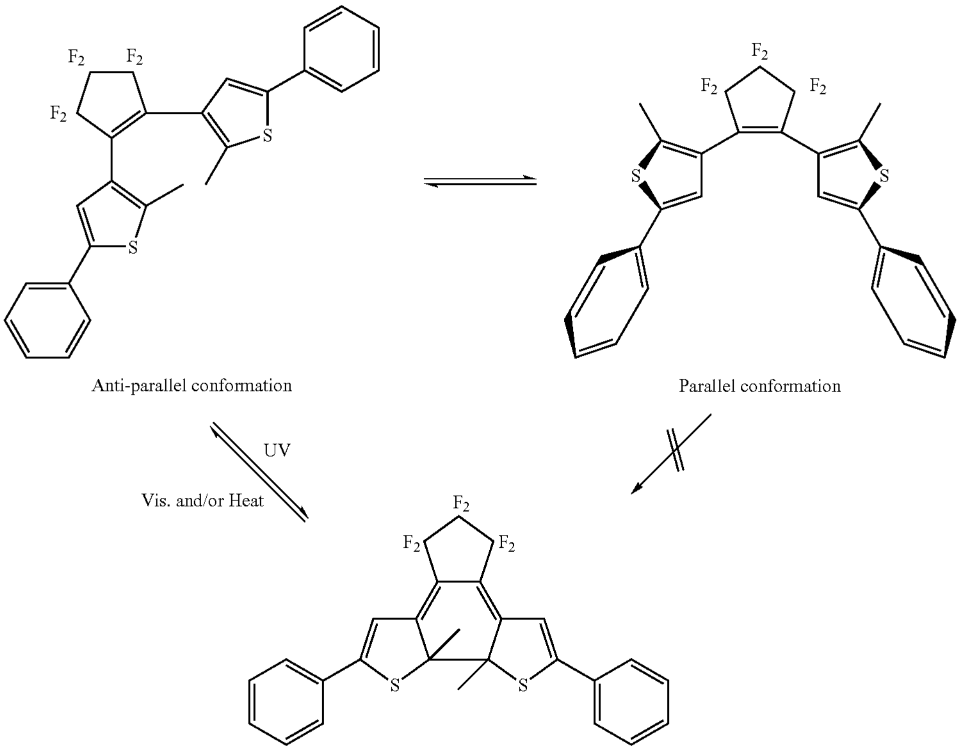

Hydrogen bonding is a well-known bond formation style between atoms which exhibits large electronegativities such as C, N, O, employing a hydrogen atom. Thermal energy can disrupt hydrogen bonding and subsequent cooling can restore the hydrogen bonds, which provides reversible bond formation. Among organic compounds, carboxylic acids readily form dimeric pairs with hydrogen bonds, even in dilute solutions. Such an dimeric pair formation of carboxylic acid with hydrogen bonds is shown in Scheme 3 (dashed lines represent the non-covalent hydrogen bonding interactions between separate carboxylic acid groups).

Scheme 3.

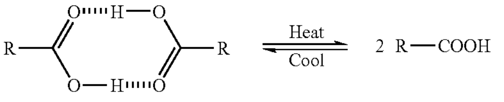

Carboxy groups are a form of Hydrogen Bonding Group (HBG) and are able to form intermolecular hydrogen bonds between molecules as well as intramolecular hydrogen bonds within a molecule. Thus, thermally reversible bond formation can be used to lock the photochrome in the parallel conformation of the colorless state of diarylethene at room temperature and consequently prevent background coloration. Intramolecular hydrogen bonds are formed within the diarylethene molecule and this inactive conformation is fixed at room temperature to prevent the coloration reaction. By elevating the temperature, however, the hydrogen bonds are disrupted and the photochromic coloration with irradiation of UV light is permitted to proceed. Because hydrogen bonding can affect the coloration reaction, it is believed that this effect would also predict that the extinction coefficient for H-bonded photochromes would be temperature dependent. In embodiments a diarylethene molecule has been investigated and has demonstrated that quantum yields of DAE ring closing can be made temperature dependent through hydrogen bond-based gating. (for example see J. Am. Chem. Soc., 1994, 116, 9894). The benzothiophene derivatized DAE employed in this study, and benzothiophene derivative DAEs in general have extremely short image permanence due to high photochemical quantum yields of the decolorization reaction and thus benzothiophene DAE structures are not suitable for longer-life erasable paper applications. The present embodiments incorporate specifically designed intramolecular hydrogen bond interactions to control the conformations of the colorless state in suitably functionalized photochromic diarylethenes for reimageable document applications, and thus, resolve the reduction in color contrast, or background coloration problem that we have discovered under fluorescent office lighting conditions with DAEs and specifically 2-alkoxy containing DAEs.

In embodiments, intramolecular hydrogen bonds (dashed line in Scheme 4) formed between two HBGs through a Q-type attachment to both A and B on either side of the alkene containing Ring (Scheme 4) lock the DAE molecule in the colorless or less colored conformation, thus preventing a coloration reaction under ambient conditions. Temperature elevation with concomitant application of UV light results in the disruption of the hydrogen bond resulting in a new bond between A and B and the more colored form of the DAE.

Scheme 4.

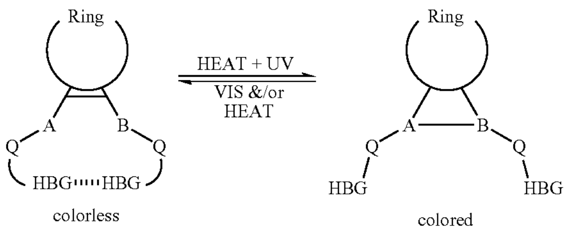

In one embodiment, intramolecular hydrogen bonds with HBGs are formed between both ends of a diarylethene molecule at the 5 and 5' positions to lock the diarylethene molecule in the photochromically inactive colorless conformation, thus preventing a coloration reaction. The molecular design of a diarylethene incorporating carboxylic acid HBGs through a alkylaryl linker Q at the 5 and 5' aryl positions of thiophene A and B is illustrated in Scheme 5.

Temperature elevation with concomitant application of UV light results in the disruption of the hydrogen bonds resulting in the transition to the photochromically active colorless conformation and the subsequent photochromic coloration reaction to form the more colored form.

Scheme 5.

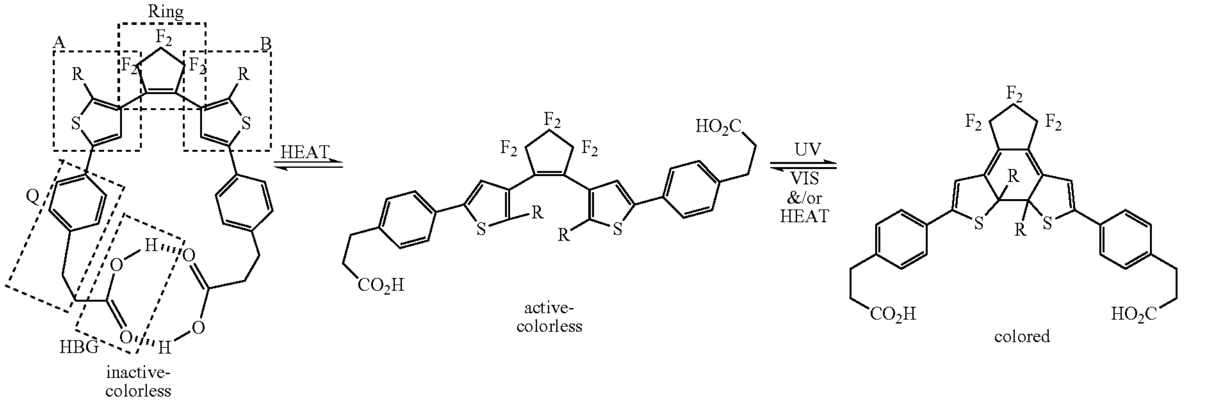

In another embodiment, the hydrogen bonding can be formed through substituents at the reactive positions (2 and 2'-positions of the aryl moieties). In the same mechanism as above, the colorless state is photochemically inactive at room temperature because the colorless state is locked in the parallel conformation. However, thermal disruption of the hydrogen bonds activate the photochromic coloration with simultaneous UV irradiation to create images (Scheme 6). Scheme 6 illustrates the coloration through a molecular design of diarylethene incorporating carboxylic acid HBGs through a alkoxyalkyl linker Q at the 2 and 2' aryl positions of thiophene A and B.

Scheme 6.

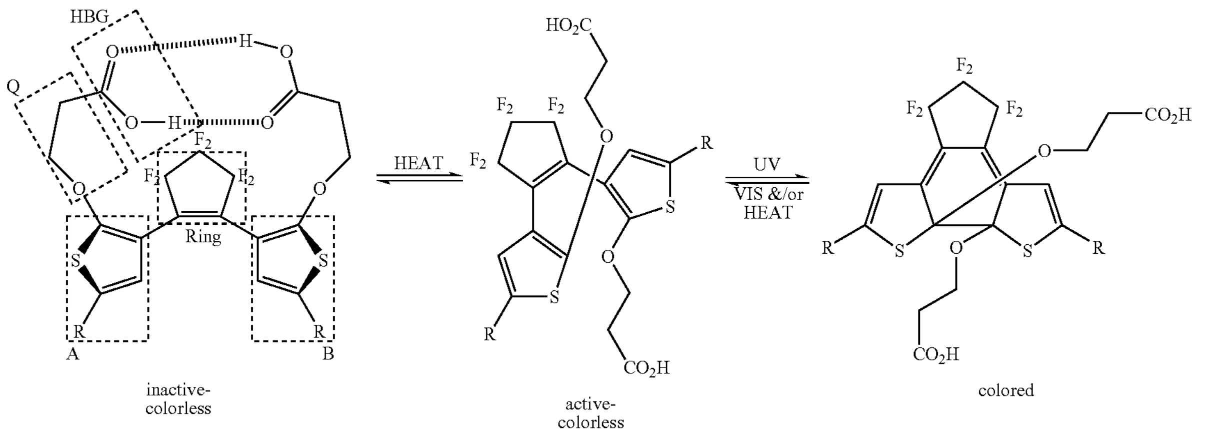

Accordingly, the image forming medium, comprises a substrate, and an imaging layer coated on or impregnated into the substrate, wherein the imaging layer comprises an imaging composition that exhibits a reversible transition between a colorless or less colored state and a colored or more colored state and further comprises a thermally gated photochromic material dissolved in a solvent or polymeric binder, the thermally gated photochromic material being a diarylethene molecule in a photochromically inactive parallel conformation to prevent coloration reaction. The substituted DAEs suitable for use in embodiments are those that can be represented by the following general formulas wherein the Ring structures in Schemes 5-6 can be represented formulas [I]-[VIII] below.

[I]

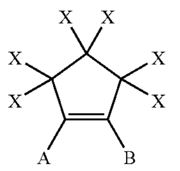

In formula [I], shown above, X independently represents H; a halogen such as chlorine, fluorine, bromine, or the like; a straight or branched, substituted or unsubstituted, alkyl group of from 1 to about 20 or to about 40 carbon atoms, such as methyl, ethyl, propyl, butyl, or the like, where the substitutions can include halogen atoms, hetero atoms (such as oxygen groups, nitrogen groups, and the like), and the like.

[II]

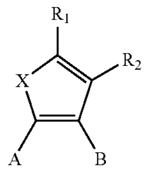

In formula [II] above, X represents S or O.

[III]

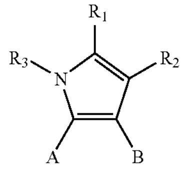

[IV]

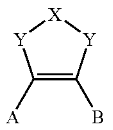

In formula [IV] above, X represents S, O or C±O, Y represents O, $CH_2$ or C═O.

[V]

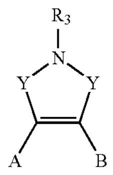

In formula [V] above, Y represents $CH_2$ or C═O.

[VI]

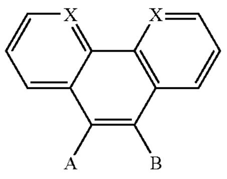

In formula [VI] above, X represents CH or N.

[VII]

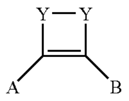

In formula [VII] above, Y represents $CH_2$ or C═O.

[VIII]

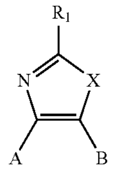

In formula [VIII] above, X represents S, O or C═O.

In formulas [II], [III], [V] and [VIII], $R_1$, $R_2$ and $R_3$ are each independently selected from an alkyl group, including substituted alkyl groups, unsubstituted alkyl groups, linear alkyl groups, and branched alkyl groups, and wherein hetero atoms such as oxygen, nitrogen, sulfur, silicon, phosphorus, boron, and the like either may or may not be present in the alkyl group, a halogen group, an alkoxy group, a cyano group, a nitro group, an amino group, an amide group, an aryl group, an alkylaryl group, including substituted alkylaryl groups, unsubstituted alkylaryl groups, and wherein hetero atoms either may or may not be present in the alkyl portion of the alkylaryl group or the aryl portion of the alkylaryl group, A represents substituents [a] or [b] or [c], and B represents substituents [d] or [e] or [f] shown below,

[a]

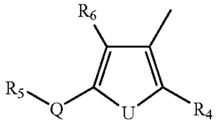

[b]

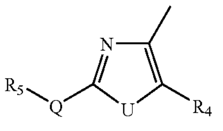

-continued

[c]

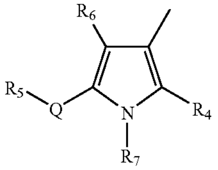

[d]

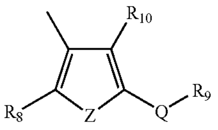

[e]

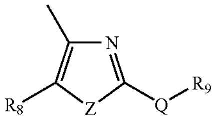

[f]

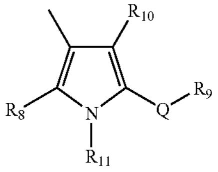

$R_4$ and $R_8$ independently represent an alkyl group, an aryloxy group, a substituted and unsubstituted heteroaromatic group, an alkoxy group, or a substituted alkoxy group, fluoroalkyl group, where the alkyl portion of the alkyl, alkoxy, or fluoroalkyl group represents a straight, branched or cyclic, substituted or unsubstituted, alkyl group of from 1 to about 40 carbon atoms. $R_5$ and $R_9$ independently represent hydrogen bond forming groups (HBG) selected from a carboxy, hydroxy, amino, amino acid, amide, and peptide groups which form pairwise hydrogen bonds with each other. $R_6$ and $R_{10}$ independently represent a hydrogen atom, an alkyl group, a halogen atom, an alkoxy group, a fluoroalkyl group, a cyano group, an aryl group, or a substituted alkylaryl group. $R_7$ and $R_{11}$ independently represent an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl. Q represents direct bonds, aryl, alkylaryl, heteroaryl, heteroalkylaryl, straight, branched or cyclic, hetero substituted or unsubstituted, alkyl groups from 1 to about 10 carbon atoms, alkenyl, alkynyl, or fluoroalkyl groups, wherein hetero atoms either may or may not be present and are optionally substituted. U and Z each independently represent sulfur or oxygen atoms.

In further embodiments, A represents substituents [g] or [h] or [i], and B represents substituents [j] or [k] or [l] shown below,

[g]

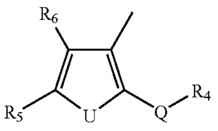

-continued

[h]

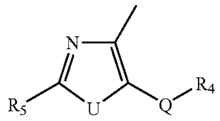

[i]

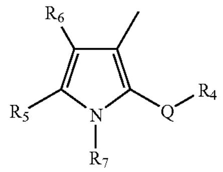

[j]

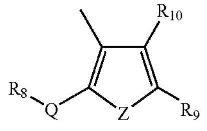

[k]

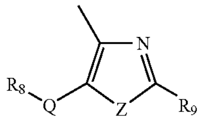

[l]

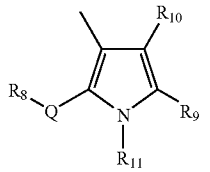

In such embodiments, $R_4$ and $R_8$ independently represents hydrogen bond forming groups (HBG) selected from a carboxy, hydroxy, amino, amino acid, amide, and peptide group which form pairwise hydrogen bonds with each other. $R_5$ and $R_9$ independently represents a hydrogen atom, a halogen atom, an aryl group, a substituted or unsubstituted alkylaryl group wherein hetero atoms either may or may not be present in the alkyl portion of the alkylaryl group or the aryl portion of the alkylaryl group, a saturated or unsaturated hydrocarbons which is optionally substituted, a fluoroalkyl group, a cyano group, a formyl group, or a carboxy group. $R_6$ and $R_{10}$ independently represents a hydrogen atom, an alkyl group, a halogen atom, an alkoxy group, a fluoroalkyl group, a cyano group, an aryl group, or a substituted alkylaryl group. $R_7$ and $R_{11}$ independently represents an alkyl group, an aryl group, an alkylaryl group including substituted alkylaryl groups, unsubstituted alkylaryl groups, and wherein hetero atoms either may or may not be present in the alkyl portion of the alkylaryl group or the aryl portion of the alkylaryl. Q represents direct bonds, aryl, alkylaryl, heteroaryl, heteroalkylaryl, alkyl or alkoxy substituted groups from 1 to about 10 carbon atoms that is straight, branched or cyclic, hetero substituted or unsubstituted, alkenyl, alkynyl, or fluoroalkyl groups, wherein hetero atoms either may or may not be present and are optionally substituted. U and Z each independently represent sulfur or oxygen atoms.

The thermally gated photochromic material converts from the less colored state to the more colored state upon exposure to light of a ultraviolet first wavelength and heat, and converts from the more colored state to the colorless state upon exposure to at least one of heat and visible light of a second wavelength different from the first wavelength. The medium is capable of undergoing multiple conversions between the colorless state and the colored state. In embodiments, the thermally gated photochromic material converts from the colorless state to the colored state only upon exposure to the ultraviolet first wavelength and heat at a temperature of from about 25° C. to about 350° C. In embodiments, the thermally gated photochromic material converts from the colored state to the colorless state only upon exposure to heat and/or visible light at a temperature of from about 25° C. to about 350° C.

In embodiments, the imaging layer generally comprises a solvent or polymer binder mixture of a photochromic material dispersed or dissolved in a solvent or polymer binder, with the mixture coated on a suitable substrate material, for example paper, or sandwiched between a first and a second substrate material, one of which is paper. If desired, the mixture can be further constrained on the substrate material, or between the first and second substrate materials, such as by microencapsulating the solvent mixture, or the like. For example, in an embodiment, the thermally gated diarylethene photochromic material and the solvent are provided in capsules.

These photochromic materials are thus different from other photochromic materials, including other differently substituted or unsubstituted diarylethenes, in that the materials are generally not readily convertible back from the colored state to the colorless state by exposure to visible light alone, but require exposure to appropriate heating, with or without visible light in order to convert back from the colored state to the colorless state. This allows for a desirable product because the colored state can be frozen until sufficient heat beyond that of ambient heat induces enough molecular and lattice mobility to allow the structural reorganization to occur. Furthermore, as stated above, thermally reversible hydrogen bond formation can be used to lock the photochrome in the parallel conformation of the colorless state of diarylethene at room temperature and consequently prevent background coloration at ambient conditions.

The image forming material (photochromic material) is dissolved or dispersed in any suitable carrier, such as a solvent, a polymer binder, or the like. Suitable solvents include, for example, straight chain aliphatic hydrocarbons, branched chain aliphatic hydrocarbons, and the like, such as where the straight or branched chain aliphatic hydrocarbons have from about 1 to about 30 carbon atoms. For example, a non-polar liquid of the ISOPAR™ series (manufactured by the Exxon Corporation) may be used as the solvent. These hydrocarbon liquids are considered narrow portions of isoparaffinic hydrocarbon fractions. For example, the boiling range of ISOPAR G™ is from about 157° C. to about 176° C.; ISOPAR H™ is from about 176° C. to about 191° C.; ISOPAR K™ is from about 177° C. to about 197° C.; ISOPAR L™ is from about 188° C. to about 206° C.; ISOPAR M™ is from about 207° C. to about 254° C.; and ISOPAR V™ is from about 254.4° C. to about 329.4° C. Other suitable solvent materials include, for example, the NORPAR™ series of liquids, which are compositions of n-paraffins available from Exxon Corporation, the SOLTROL™ series of liquids available from the Phillips Petroleum Company, and the SHELLSOL™ series of liquids available from the Shell Oil Company. Mixtures of one or more solvents, e.g., a solvent system, can also be used, if desired. In addition, more polar solvents can also be used. Examples of more polar solvents that may be used include halogenated and nonhalogenated solvents, such as tetrahydrofuran, trichloro- and tetrachloroethane, dichloromethane, chloroform, monochlorobenzene, toluene, xylenes, acetone, methanol, ethanol, xylenes, benzene, ethyl acetate, dimethylformamide, cyclohexanone, N-methyl acetamide and the like. The solvent may be composed of one, two, three or more different solvents. When two or more different solvents are present, each solvent may be present in an equal or unequal amount by weight ranging for example from about 5 percent to 90 percent, particularly from about 30 percent to about 50 percent, based on the weight of all solvents.

Both compositions dispersable in either organic polymers or waterborne polymers can be used, depending on the used components. For example, for waterborne compositions, polyvinylalcohol is a suitable application solvent, and polymethylmethacrylate is suitable for organic soluble compositions. Suitable examples of polymer binders include, but are not limited to, polyalkylacrylates like polymethyl methacrylate (PMMA), polycarbonates, polyethylenes, oxidized polyethylene, polypropylene, polyisobutylene, polystyrenes, poly (styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acid, and the like. Copolymer materials such as polystyrene-acrylonitrile, polyethylene-acrylate, vinylidenechloride-vinylchloride, vinylacetate-vinylidene chloride, styrene-alkyd resins are also examples of suitable binder materials. The copolymers may be block, random, or alternating copolymers. In some embodiments, polymethyl methacrylate or a polystyrene is the polymer binder, in terms of their cost and wide availability. The polymer binder, when used, has the role to provide a coating or film forming composition.

Phase change materials can also be used as the polymer binder. Phase change materials are known in the art, and include for example crystalline polyethylenes such as Polywax® 2000, Polywax® 1000, Polywax® 500, and the like from Baker Petrolite, Inc.; oxidized wax such as X-2073 and Mekon wax, from Baker-Hughes Inc.; crystalline polyethylene copolymers such as ethylene/vinyl acetate copolymers, ethylene/vinyl alcohol copolymers, ethylene/acrylic acid copolymers, ethylene/methacrylic acid copolymers, ethylene/carbon monoxide copolymers, polyethylene-b-polyalkylene glycol wherein the alkylene portion can be ethylene, propylene, butylenes, pentylene or the like, and including the polyethylene-b-(polyethylene glycol)s and the like; crystalline polyamides; polyester amides; polyvinyl butyral; polyacrylonitrile; polyvinyl chloride; polyvinyl alcohol hydrolyzed; polyacetal; crystalline poly(ethylene glycol); poly (ethylene oxide); poly(ethylene therephthalate); poly(ethyl ene succinate); crystalline cellulose polymers; fatty alcohols; ethoxylated fatty alcohols; and the like, and mixtures thereof.

In general, most any organic polymer can be used. However, in embodiments, because heat is used to erase the visible image, the polymer can be selected such that it has thermal properties that can withstand the elevated temperatures that may be used for erasing formed images based on the specific alkoxy and alkyl substituted DAE photochrome that is chosen.

In embodiments, the imaging composition can be applied in one form, and dried to another form for use. Thus, for example, the imaging composition comprising photochromic material and solvent or polymer binder may be dissolved or dispersed in a solvent for application to or impregnation into a substrate, with the solvent being subsequently evaporated to form a dry layer.

In general, the imaging composition can include the carrier and imaging material in any suitable amounts, such as from about 5 to about 99.5 percent by weight carrier, such as from about 30 to about 70 percent by weight carrier, and from about 0.05 percent to about 50 percent by weight photochromic material, such as from about 0.1 to about 5 percent of photochromic material by weight.

For applying the imaging layer to the image forming medium, the image forming layer composition can be applied in any suitable manner. For example, the image forming layer composition can be mixed and applied with any suitable solvent or polymer binder, and subsequently hardened or dried to form a desired layer. Further, the image forming layer composition can be applied either as a separate distinct layer to the supporting substrate, or it can be applied so as to impregnate into the supporting substrate.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming paper medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate, such as paper, may be used. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. In embodiments, the substrate has a thickness ranging for example from about 0.050 mm to about 5 mm, although smaller or greater thicknesses can be used, if desired.

When an opaque layer is used in the image forming medium, any suitable material may be used. For example, where a white paper-like appearance is desired, the opaque layer may be formed from a thin coating of titanium dioxide, or other suitable material like zinc oxide, inorganic carbonates, and the like. The opaque layer can have a thickness of, for example, from about 0.01 mm to about 10 mm, such as about 0.1 mm to about 5 mm, although other thicknesses can be used.

If desired, a further overcoating layer may also be applied over the applied imaging layer. The further overcoating layer may, for example, be applied to further adhere the underlying layer in place over the substrate, to provide wear resistance, to improve appearance and feel, and the like. The overcoating layer can be the same as or different from the substrate material, although in embodiments at least one of the overcoating layer and substrate layer is clear and transparent to permit visualization of the formed image. The overcoating layer can have a thickness of, for example, from about 0.001 mm to about 10 mm, such as about 0.01 mm to about 5 mm, although other thicknesses can be used. For example, if desired or necessary, the coated substrate can be laminated between supporting sheets such as plastic sheets.

In embodiments where the imaging material is coated on or impregnated into the paper substrate, the coating can be conducted by any suitable method available in the art, and the coating method is not particularly limited. For example, the imaging material can be coated on or impregnated into the paper substrate by dip coating the paper substrate into a solution of the imaging material composition followed by any necessary drying, or the paper substrate can be coated with the imaging composition to form a layer thereof. Similarly, the protective coating can be applied by similar methods.

Where the photochromic material is mixed with a solvent applied on the paper substrate, and where the solvent system is retained in the final product, additional processing may be required. As a result, where the photochromic material is simply coated on the paper substrate, a cover material is generally applied over the solvent system to constrain the solvent system in place on the substrate. Thus, for example, the cover material can be a solid layer, such as any of the suitable materials disclosed above for the substrate layer. In an alternative embodiment, a polymer material or film may be applied over the photochromic material, where the polymer film penetrates the photochromic material at discrete points to in essence form pockets or cells of photochromic material that are bounded on the bottom by the substrate and on the sides and top by the polymeric material. The height of the cells can be, for example, from about 1 micron to about 1000 microns, although not limited thereto. The cells can be any shape, for example square, rectangle, circle, polygon, or the like. In these embodiments, the cover material is advantageously transparent and colorless, to provide the full color contrast effect provided by the photochromic material.

In another embodiment, the solvent system with the photochromic material can be encapsulated or microencapsulated, and the resultant capsules or microcapsules deposited or coated on the substrate as described above. Any suitable encapsulation technique can be used, such as simple and complex coacervation, interfacial polymerization, in situ polymerization, phase separation processes. For example, a suitable method if described for ink materials in U.S. Pat. No. 6,067,185, the entire disclosure of which is incorporated herein by reference and can be readily adapted to the present disclosure. Useful exemplary materials for simple coacervation include gelatin, polyvinyl alcohol, polyvinyl acetate and cellulose derivatives. Exemplary materials for complex coacervation include gelatin, acacia, acrageenan, carboxymethylecellulose, agar, alginate, casein, albumin, methyl vinyl ether-co-maleic anhydride. Exemplary useful materials for interfacial polymerization include diacyl chlorides such as sebacoyl, adipoyl, and di or poly-amines or alcohols and isocyanates. Exemplary useful materials for in situ polymerization include for example polyhydroxyamides, with aldehydes, melamine or urea and formaldehyde; water-soluble oligomers of the condensate of melamine or urea and formaldehyde, and vinyl monomers such as for example styrene, methyl methacrylate and acrylonitrile. Exemplary useful materials for phase separation processes include polystyrene, polymethylmethacrylate, polyethylmethacrylate, ethyl cellulose, polyvinyl pyridine and polyacrylonitrile. In these embodiments, the encapsulating material is also transparent and colorless, to provide the full color contrast effect provided by the photochromic material.

Where the photochromic material is encapsulated, the resultant capsules can have any desired average particle size. For example, suitable results can be obtained with capsules having an average size of from about 1 to about 1000 microns, such as from about 10 to about 600 or to about 800 microns, or from about 20 to about 100 microns, where the average size refers to the average diameter of the microcapsules and can be readily measured by any suitable device such as an optical microscope. For example, in embodiments, the capsules are large enough to hold a suitable amount of photochromic material to provide a visible effect when in the colored form, but are not so large as to prevent desired image resolution.

In its method aspects, the present disclosure involves providing an image forming medium comprised of a substrate and an imaging layer comprising a thermally gated photochromic material dispersed in a solvent or polymeric binder, wherein the composition exhibits a reversible transition between a colorless and a colored state. The thermally gated photochromic material is a diarylethene molecule having at least a majority of conformers in the inactive parallel conformation. For example, the DAE molecule has carboxy groups bonded together through hydrogen bonds, and further wherein the carboxy groups are attached at phenyl groups at both ends of the diarylethene molecule or are attached at 2-positions of thiophene moieties at both ends of the diarylethene molecule.

To provide separate writing and erasing processes, imaging is conducted by applying a first stimulus, such as UV light irradiation, to the imaging material to cause a color change, and erasing is conducted by applying a second, different stimulus, such as UV or visible light irradiation, and optionally heat, to the imaging material to reverse the color change. In other embodiments, the erasing is conducted by applying both visible light and heat, or by applying heat alone. Thus, for example, the imaging layer as a whole could be sensitive at a first (such as UV) wavelength that causes the photochromic material to convert from a clear to a colored state, while the imaging layer as a whole could be sensitive at a second, different (such as visible) wavelength and/or to heat that causes the photochromic material to convert from the colored back to the clear state.

In embodiments, heating can be applied to the imaging layer before or at the same time as the light irradiation, for either the writing and/or erasing processes. When used, the heat raises the temperature of the imaging composition, particularly the photochromic material, to raise the mobility of the imaging composition and thus allow easier and faster conversion from one color state to the other. The heating can be applied before or during the irradiation, or by itself, as long as the heating causes the imaging composition to be raised to the desired temperature during the irradiation or erasing process. Any suitable heating temperature can be used, and will depend upon, for example, the specific imaging composition used. For example, where the photochromic material is dispersed in a polymer or a phase change composition, the heating can be conducted to raise the polymer to at or near its glass transition temperature or melting point, such as within about 5° C., within about 10° C., or within about 20° C. of the glass transition temperature or melting point, although it is desired in certain embodiments that the temperature not exceed the melting point of the polymer binder so as to avoid undesired movement or flow of the polymer on the substrate.

The different stimuli, such as different light irradiation wavelengths, can be suitably selected to provide distinct writing and erasing operations. For example, in one embodiment, the photochromic material is selected to be sensitive to UV light to cause isomerization from the clear state to the colored state, but to be sensitive to visible light to cause isomerization from the colored state to the clear state. In other embodiments, the writing and erasing wavelengths are separated by at least about 10 nm, such as at least about 20 nm, at least about 30 nm, at least about 40 nm, at least about 50 nm, or at least about 100 nm. Thus, for example, if the writing wavelength is at a wavelength of about 360 nm, then the erasing wavelength is desirably a wavelength of greater than about 400 nm, such as greater than about 500 nm. Of course, the relative separation of sensitization wavelengths can be dependent upon, for example, the relatively narrow wavelengths of the exposing apparatus.

In a writing process, the image forming medium is exposed to an imaging light having an appropriate activating wavelength, such as a UV light source such as a light emitting diode (LED), in an imagewise fashion. The imaging light supplies sufficient energy to the photochromic material to cause the photochromic material to convert, such as isomerize, from a clear state to a colored state to produce a colored image at the imaging location, and for the photochromic material to isomerize to stable isomer forms to lock in the image. The amount of energy irradiated on a particular location of the image forming medium can affect the intensity or shade of color generated at that location. Thus, for example, a weaker intensity image can be formed by delivering a lesser amount of energy at the location and thus generating a lesser amount of colored photochromic unit, while a stronger intensity image can be formed by delivering a greater amount of energy to the location and thus generating a greater amount of colored photochromic unit. When suitable photochromic material, solvent or polymer binder, and irradiation conditions are selected, the variation in the amount of energy irradiated at a particular location of the image forming medium can thus allow for formation of grayscale images, while selection of other suitable photochromic materials can allow for formation of full color images.

Once an image is formed by the writing process, the formation of stable isomer forms of the photochromic material within the imaging materials locks in the image. That is, the isomer forms of the new photochromic materials are more stable to ambient heat and light, and thus exhibit greater long-term stability. The image is thereby "frozen" or locked in, and cannot be readily erased in the absence of a specific second stimuli. In embodiments, the image is locked in, and cannot be readily erased by ambient heat or light, and requires elevated temperature and or a light stimulus in order to revert back to the colorless state. The imaging substrate thus provides a reimageable substrate that exhibits a long-lived image lifetime, but which can be erased as desired and reused for additional imaging cycles.

In an erasing process, the writing process is essentially repeated, except that a different stimuli, such as a different wavelength irradiation light, such as visible light, is used, and/or when the photochromic material is optionally heated such as to a temperature at or near a glass transition, melting, or boiling point temperature of the carrier material. For example, the heating can be conducted at a temperature of from about 25 to about 350° C., such as from about 100 to about 200° C. or about 80 to about 160° C. The erasing process causes the isomerizations to reverse and the photochromic unit to convert, such as isomerize, from a colored state to a clear state to erase the previously formed image at the imaging location. The erasing procedure can be on an image-wise fashion or on the entire imaging layer as a whole, as desired. The heating step is optional, in that certain compositions can be provided that are erased upon only exposure to the selected stimulus such as light wavelength, while other compositions can be provided that can be erased only under a heating condition, optionally upon exposure to the selected stimulus such as light wavelength.

The separate imaging lights used to form the transient image may have any suitable predetermined wavelength scope such as, for example, a single wavelength or a band of wavelengths. In various exemplary embodiments, the imaging light is an ultraviolet (UV) light having a single wavelength or a narrow band of wavelengths. For example, the UV light can be selected from the UV light wavelength range of about 200 nm to about 475 nm, such as a single wavelength at about 365 nm or a wavelength band of from about 350 nm to about 370 nm or from about 370 nm to about 390 nm or from about 390 nm to about 410 nm. For forming the image, the image forming medium may be exposed to the respective imaging light for a time period ranging from about 10 milliseconds to about 5 minutes, particularly from about 30 milliseconds to about 1 minute. The imaging light may have an intensity ranging from about 0.1 $mW/cm^2$ to about 100 $mW/cm^2$, particularly from about 5 $mW/cm^2$ to about 40 $mW/cm^2$.

The erasing light is strong visible light of a wavelength which overlaps with the absorption spectrum of the colored state isomer in the visible region. For example the erasing useful light may have a wavelength ranging from about 400 nm to about 800 nm or more preferably form about 500 nm to about 800 nm. The usable Visible light of the erasing may be obtained form a Xenon light source with a bulb having a power from 5 W to about 1000 W or more preferably from about 20 W to about 200 W, which is placed in the proximity of the areas of the document which is to be erased. Another suitable erasing light source is an LED having a wavelength in the visible region of the light spectrum, as defined above. The erasing light may be having a single wavelength or a narrow band of wavelengths.

In various exemplary embodiments, imaging light corresponding to the predetermined image may be generated for example by laser and raster or a Light Emitting Diode (LED) array screen and the image is formed on the image forming medium by placing the medium on or in proximity to the LED screen for the desired period of time. In other exemplary embodiments, a UV Raster Output Scanner (ROS) may be used to generate the UV light in an image-wise pattern. This embodiment is particularly applicable, for example, to a printer device that can be driven by a computer to generate printed images in an otherwise conventional fashion. That is, the printer can generally correspond to a conventional inkjet printer, except that the inkjet printhead that ejects drops of ink in the imagewise fashion can be replaced by a suitable UV light printhead that exposes the image forming medium in an imagewise fashion. In this embodiment, the replacement of ink cartridges is rendered obsolete, as writing is conducted using a UV light source. The printer can also include a heating device, which can be used to apply heat to the imaging material to erase any existing images. Other suitable imaging techniques that can be used include, but are not limited to, irradiating a UV light onto the image forming medium through a mask, irradiating a pinpoint UV light source onto the image forming medium in an imagewise manner such as by use of a light pen, and the like.

For erasing an image in order to reuse the imaging substrate, in various exemplary embodiments, the substrate can be exposed to a suitable imaging light, to cause the image to be erased. Such erasure can be conducted in any suitable manner, such as by exposing the entire substrate to the erasing light at once, exposing the entire substrate to the erasing light in a successive manner such as by scanning the substrate, or the like. In other embodiments, erasing can be conducted at particular points on the substrate, such as by using a light pen, or the like.

According to various exemplary implementations, the color contrast that renders the image visible to an observer may be a contrast between, for example two, three or more different colors. The term "color" may encompass a number of aspects such as hue, lightness and saturation, where one color may be different from another color if the two colors differ in at least one aspect. For example, two colors having the same hue and saturation but are different in lightness would be considered different colors. Any suitable colors such as, for example, red, white, black, gray, yellow, cyan, magenta, blue, and purple, can be used to produce a color contrast as long as the image is visible to the naked eye of a user. However, in terms of desired maximum color contrast, a desirable color contrast is a dark gray or black image on a light or white background, such as a gray, dark gray, or black image on a white background, or a gray, dark gray, or black image on a light gray background.

In various exemplary embodiments, the color contrast may change such as, for example, diminish during the visible time, but the phrase "color contrast" may encompass any degree of color contrast sufficient to render an image discernable to a user regardless of whether the color contrast changes or is constant during the visible time.

While the description above refers to particular embodiments, it will be understood that many modifications may be made without departing from the spirit thereof. The accompanying claims are intended to cover such modifications as would fall within the true scope and spirit of embodiments herein.

The presently disclosed embodiments are, therefore, to be considered in all respects as illustrative and not restrictive, the scope of embodiments being indicated by the appended claims rather than the foregoing description. All changes that come within the meaning of and range of equivalency of the claims are intended to be embraced therein.

All the patents and applications referred to herein are hereby specifically, and totally incorporated herein by reference in their entirety in the instant specification.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. An image forming medium, comprising:

a substrate; and an imaging layer coated on or impregnated into the substrate, wherein the imaging layer comprises an imaging composition that exhibits a reversible transition between a colorless state and a colored state and further comprises a thermally gated diarylethene photochromic material dissolved in a solvent or polymeric binder, and further wherein the diarylethene photochromic material comprises a diarylethene molecule represented by a general formula selected from the group consisting of

[I]

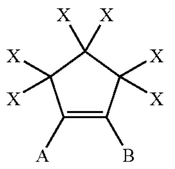

[II]

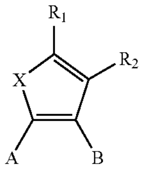

[III]

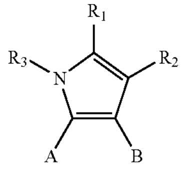

[IV]

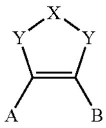

[V]

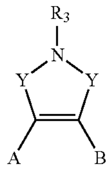

[VI]

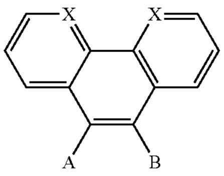

[VII]

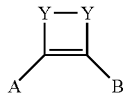 and

[VIII]

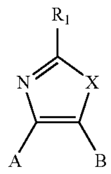

wherein in formula (I) each X independently represents a hydrogen, an alkyl chain having 1 to 20 carbon atoms, cyano, fluorine, bromine, chlorine or an iodine atom; in formula (II) X represents S or O; in formula (IV) X represents S, O or C═O, and Y represents O, $CH_2$ or C═O; in formula (V) Y represents $CH_2$ or C═O; in formula (VI), X represents CH or N; in formula (VII), Y represents $CH_2$ or C═O; in formula (VIII), X represents S or O; and in formulas (II), (III), (V) and (VIII), $R_1$-$R_3$ represents an alkyl group wherein the alkyl group can be a straight, branched or cyclic, substituted or unsubstituted, from 1 to about 40 carbon atoms, an substituted or unsubstituted aromatic or heteroaromatic group;

further wherein:

A represents a formula selected from the group consisting of (g), (h) and (i) as shown below; and B represents a formula selected from the group consisting of (j), (k) and (l) as shown below

[g]

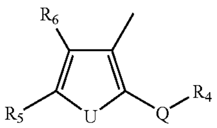

[h]

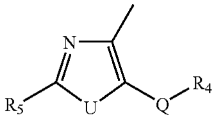

[i]

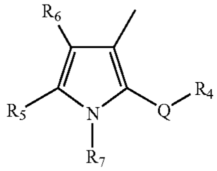

[j]

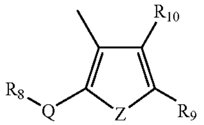

[k]

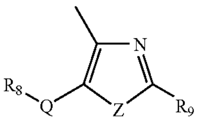

[l]

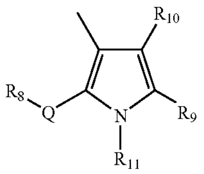

and further wherein:

$R_4$ and $R_8$ independently represent hydrogen bond forming groups selected from the group consisting of a carboxy, hydroxy, amino, amino acid, amide, and peptide group which form pairwise hydrogen bonds with each other;

$R_5$ and $R_9$ independently represent a hydrogen atom, a halogen atom, an aryl group, a substituted or unsubstituted alkylaryl group wherein hetero atoms either may or may not be present in the alkyl portion of the alkylaryl group or the aryl portion of the alkylaryl group, a saturated or unsaturated hydrocarbons which is optionally substituted, a fluoroalkyl group, a cyano group, a formyl group, or a carboxy group;

$R_6$ and $R_{10}$ independently represent a hydrogen atom, an alkyl group, a halogen atom, an alkoxy group, a fluoroalkyl group, a cyano group, an aryl group, or a substituted alkylaryl group;

$R_7$ and $R_{11}$ independently represent an alkyl group, an aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl;

Q represents direct bonds, aryl, alkylaryl, heteroaryl, heteroalkylaryl, straight, branched or cyclic, hetero substituted or unsubstituted, alkyl groups from 1 to about 10 carbon atoms, alkenyl, alkynyl, or fluoroalkyl groups, wherein hetero atoms either may or may not be present and are optionally substituted; and U and Z each independently represent sulfur or oxygen atoms.

2. The image forming medium of claim 1, wherein the diarylethene photochromic material comprises a diarylethene molecule that is

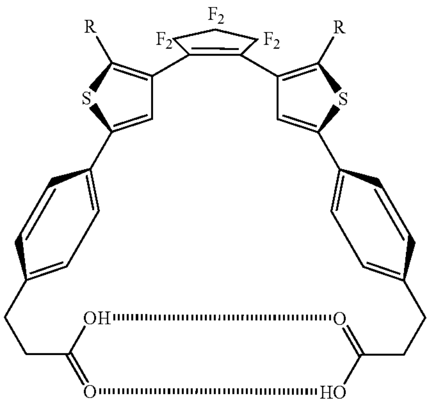

wherein R is selected from the group consisting of an alkyl group, an alkoxy group, and mixtures thereof.

3. The imaging forming medium of claim 1, wherein the diarylethene photochromic material comprises a diarylethene molecule that is

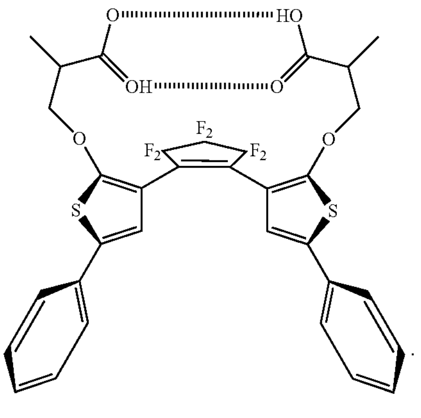

4. The imaging forming medium of claim 1, wherein the thermally gated photochromic material converts from the colorless state to the colored state upon exposure to light of a ultraviolet first wavelength and heat, and converts from the colored state to the colorless state upon exposure to at least one of heat and visible light of a second wavelength different from the first wavelength.

5. The imaging forming medium of claim 4, wherein the medium is capable of undergoing multiple conversions between the colorless state and the colored state.

6. The image forming medium of claim 4, wherein the thermally gated photochromic material converts from the colorless state to the colored state only upon exposure to the ultraviolet first wavelength and heat at a temperature of from about 25° C. to about 350° C.

7. The imaging forming medium of claim 1, wherein the thermally gated photochromic material converts from the colored state to the colorless state upon exposure to at least one of visible light and heat at a temperature of from about 25° C. to about 350° C.

8. The imaging forming medium of claim 1, wherein the imaging composition is applied to the substrate in a layer or as microcapsules.

9. The imaging forming medium of claim 1, wherein the polymeric binder is selected from the group consisting of polyalkylacrylates, polycarbonates, polyethylenes, oxidized polyethylene, polypropylene, polyisobutylene, polystyrenes, poly(styrene)-co-(ethylene), polysulfones, polyethersulfones, polyarylsulfones, polyarylethers, polyolefins, polyacrylates, polyvinyl derivatives, cellulose derivatives, polyurethanes, polyamides, polyimides, polyesters, silicone resins, epoxy resins, polyvinyl alcohol, polyacrylic acide, polystyrene-acrylonitrile, polyethylene-acrylate, vinylidenechloride-vinylchloride, vinylacetate-vinylidene chloride, styrene-alkyd resins, and mixtures thereof.

10. The imaging forming medium of claim 1, wherein the solvent is selected from the group consisting of straight chain aliphatic hydrocarbons, branched chain aliphatic hydrocarbons, halogenated and nonhalogenated solvents, and mixtures thereof.

11. The imaging forming medium of claim 10, wherein the solvent is selected from the group consisting of tetrahydrofuran, trichloroethane, tetrachloroethane, dichloromethane, chloroform, monochlorobenzene, toluene, xylenes, acetone, methanol, ethanol, benzene, ethyl acetate, dimethylformamide, cyclohexanone, N-methylacetamide and mixtures thereof.

12. The imaging forming medium of claim 1, wherein the thermally gated diarylethene photochromic material and the solvent are provided in capsules.

13. The imaging forming medium of claim 1, wherein the thermally gated photochromic material is present in an amount of from about 0.05 percent to about 50 percent by weight of a total weight of the imaging composition.

14. The imaging forming medium of claim 1, wherein the substrate is selected from the group consisting of plain paper and coated paper, clear, translucent, or opaque plastic, no tear paper, and mixtures thereof.

15. The imaging forming medium of claim 1, wherein the medium has two sides and the thermally gated photochromic material is present on the two sides such that the two sides are both reimageable.

16. An image forming medium, comprising:

a substrate; and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a diarylethene molecule having hydrogen bond forming groups bonded together through hydrogen bonds, and further wherein the hydrogen bond forming groups are attached at phenyl groups at both ends of the diarylethene molecule or are attached at 2-positions of thiophene moieties at both ends of the diarylethene molecule.

17. The imaging forming medium of claim 16, wherein the thermally gated photochromic material converts from the colorless state to the colored state upon exposure to light of a ultraviolet first wavelength and heat, and converts from the colored state to the colorless state upon exposure to at least one of heat and visible light of a second wavelength different from the first wavelength.

18. The imaging forming medium of claim 16, wherein the medium is capable of undergoing multiple conversions between the colorless state and the colored state.

19. The image forming medium of claim 16, wherein the thermally gated photochromic material converts from the colorless state to the colored state only upon exposure to the ultraviolet first wavelength and heat at a temperature of from about 25° C. to about 350° C.

20. A method for forming an image, comprising:

providing an image forming medium comprising a substrate, and an imaging layer coated on or impregnated into the substrate, wherein the imaging layer comprises an imaging composition that exhibits a reversible transition between a colorless state and a colored state and further comprises a thermally gated photochromic material dissolved in a solvent or polymeric binder, the thermally gated photochromic material being a diarylethene molecule represented by a general formula selected from the group consisting of

[I]

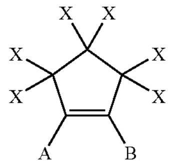

[II]

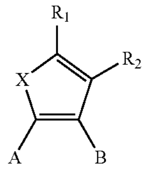

[III]

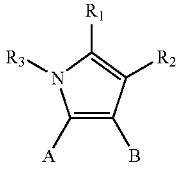

[IV]

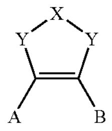

[V]

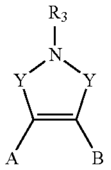

-continued

[VI]

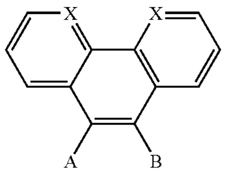

[VII]

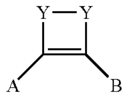

and

[VIII]

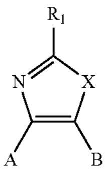

wherein in formula (I) each X independently represents a hydrogen, an alkyl chain having 1 to 20 carbon atoms, cyano, fluorine, bromine, chlorine or an iodine atom; in formula (II) X represents S or O; in formula (IV) X represents S, O or C═O, and Y represents O, $CH_2$ or C═O; in formula (V) Y represents $CH_2$ or C═O; in formula (VI), X represents CH or N; in formula (VII), Y represents $CH_2$ or C═O; in formula (VIII), X represents S or O; and in formulas (II), (III), (V) and (VIII), $R_1$-$R_3$ represents an alkyl group wherein the alkyl group can be a straight, branched or cyclic, substituted or unsubstituted, from 1 to about 40 carbon atoms, an substituted or unsubstituted aromatic or heteroaromatic group;

further wherein:

A represents a formula selected from the group consisting of (g), (h) and (i) as shown below; and B represents a formula selected from the group consisting of (j), (k) and (l) as shown below

[g]

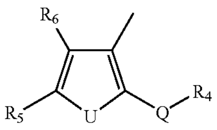

[h]

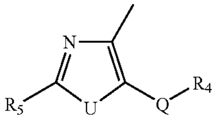

[i]

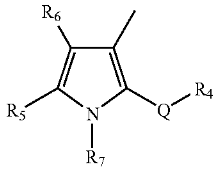

[j]

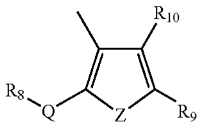

-continued

[k]

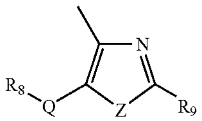

[l]

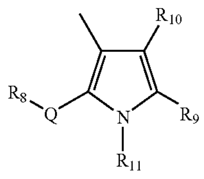

and further wherein:

$R_4$ and $R_8$ independently represent hydrogen bond forming groups selected from the group consisting of a carboxy, hydroxy, amino, amino acid, amide, and peptide group which form pairwise hydrogen bonds with each other;

$R_5$ and $R_9$ independently represent a hydrogen atom, a halogen atom, an aryl group, a substituted or unsubstituted alkylaryl group wherein hetero atoms either may or may not be present in the alkyl portion of the alkylaryl group or the aryl portion of the alkylaryl group, a saturated or unsaturated hydrocarbons which is optionally substituted, a fluoroalkyl group, a cyano group, a formyl group, or a carboxy group;

$R_6$ and $R_{10}$ independently represent a hydrogen atom, an alkyl group, a halogen atom, an alkoxy group, a fluoroalkyl group, a cyano group, an aryl group, or a substituted alkylaryl group;

$R_7$ and $R_{11}$ independently represent an alkyl group, an aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl;

Q represents direct bonds, aryl, alkylaryl, heteroaryl, heteroalkylaryl, straight, branched or cyclic, hetero substituted or unsubstituted, alkyl groups from 1 to about 10 carbon atoms, alkenyl, alkynyl, or fluoroalkyl groups, wherein hetero atoms either may or may not be present and are optionally substituted; and U and Z each independently represent sulfur or oxygen atoms; and exposing the image forming medium to ultraviolet irradiation of a first wavelength and heat in an imagewise manner to form a visible image.

21. The method of claim 20, further comprising:

exposing the image forming medium bearing the image to at least one of heat and visible light of a second wavelength different from the first wavelength to cause the thermally gated photochromic material to change from the colored state to the colorless state; and repeating the step of exposing the image forming medium to the ultraviolet irradiation of the first wavelength and heat in an imagewise manner at least one additional time.

22. The method of claim 20, wherein the diarylethene molecule is

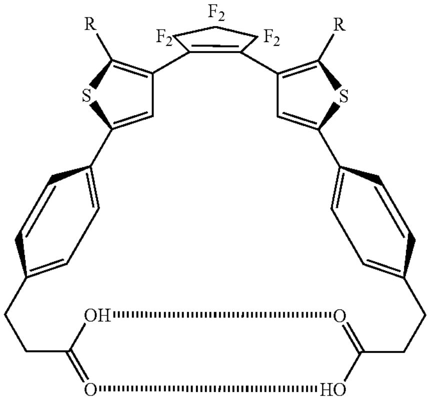

wherein R is selected from the group consisting of an alkyl group, an alkoxy group, and mixtures thereof, or wherein the diarylethene molecule is represented by a general formula selected from the group consisting of

[I]

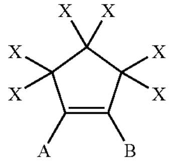

[II]

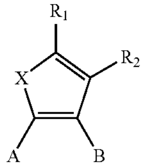

[III]

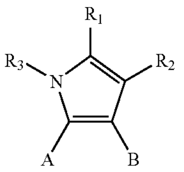

[IV]

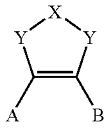

[V]

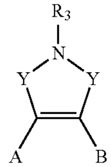

-continued

[VI]

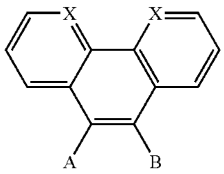

[VII]

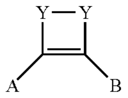

and

[VIII]

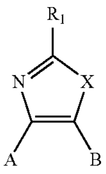

wherein in formula (I) each X independently represents a hydrogen, an alkyl chain having 1 to 20 carbon atoms, cyano, fluorine, bromine, chlorine or an iodine atom; in formula (II) X represents S or O; in formula (IV) X represents S, O or C═O, and Y represents O, $CH_2$ or C═O; in formula (V) Y represents $CH_2$ or C═O; in formula (VI) X represents CH or N; in formula (VII) Y represents $CH_2$ or C═O; in formula (VIII) X represents S or O; and in formulas (II), (III), (V) and (VIII) $R_1$-$R_3$ represents an alkyl group wherein the alkyl group can be a straight, branched or cyclic, substituted or unsubstituted, from 1 to about 40 carbon atoms, an substituted or unsubstituted aromatic or heteroaromatic group;

further wherein:

A represents a formula selected from the group consisting of (a), (b), and (c) as shown below; and B represents a formula selected from the group consisting of (d), (e), and (f) as shown below

[a]

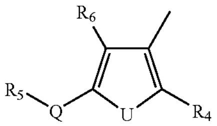

[b]

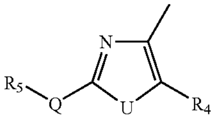

[c]

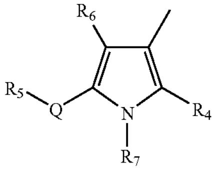

[d]

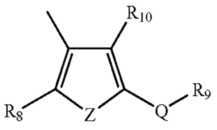

-continued

[e]

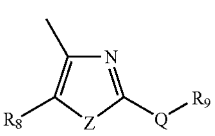

[f]

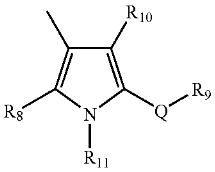

and further wherein:

$R_4$ and $R_8$ independently represent an alkyl group, an aryloxy group, a substituted and unsubstituted heteroaromatic group, an alkoxy group, or a substituted alkoxy group, fluoroalkyl group, where the alkyl portion of the alkyl, alkoxy, or fluoroalkyl group represents a straight, branched or cyclic, substituted or unsubstituted, alkyl group of from 1 to about 40 carbon atoms;

$R_5$ and $R_9$ independently represent hydrogen bond forming groups selected from the group consisting of a carboxy, hydroxy, amino, amino acid, amide, and peptide group which form pairwise hydrogen bonds with each other;

$R_6$ and $R_{10}$ independently represent a hydrogen atom, an alkyl group, a halogen atom, an alkoxy group, a fluoroalkyl group, a cyano group, an aryl group, or a substituted alkylaryl group;

$R_7$ and $R_{11}$ independently represent an alkyl group, an aryl group, or an alkylaryl group including substituted alkylaryl groups, unsubstituted alkylaryl groups, and wherein hetero atoms either may or may not be present in the alkyl portion of the alkylaryl group or the aryl portion of the alkylaryl;

Q represents direct bonds, aryl, alkylaryl, heteroaryl, heteroalkylaryl, straight, branched or cyclic, hetero substituted or unsubstituted, alkyl groups from 1 to about 10 carbon atoms, alkenyl, alkynyl, or fluoroalkyl groups, wherein hetero atoms either may or may not be present and are optionally substituted; and U and Z each independently represent sulfur or oxygen atoms.

23. The method of claim 20, wherein the thermally gated photochromic material converts from the colored state to the colorless state upon exposure to at least one of visible light and heat at a temperature of from about 25° C. to about 350° C.

24. The method of claim 20, wherein the exposing step is for a time period ranging from about 10 milliseconds to about 5 minutes at an intensity ranging from about 0.1 $mW/cm^2$ to about 100 $mW/cm^2$.

* * * * *